United States Patent [19]

Eichelberger et al.

[11] 4,006,492
[45] Feb. 1, 1977

[54] HIGH DENSITY SEMICONDUCTOR CHIP ORGANIZATION

[75] Inventors: Edward Baxter Eichelberger, Purdy Station; Gordon Jay Robbins, Wappingers Falls, both of N.Y.

[73] Assignee: International Business Machines Corporation, Armonk, N.Y.

[22] Filed: June 23, 1975

[21] Appl. No.: 589,231

[52] U.S. Cl. .................................. 357/45; 357/55; 357/68; 357/71
[51] Int. Cl.² ................. H01L 27/10; H01L 29/06; H01L 23/48
[58] Field of Search ................... 357/45, 55, 68, 71

[56] References Cited
UNITED STATES PATENTS

| | | | |
|---|---|---|---|
| 3,475,621 | 10/1969 | Weinberger | 357/45 |
| 3,771,217 | 11/1973 | Hartman | 357/71 |

Primary Examiner—Edward J. Wojciechowicz
Attorney, Agent, or Firm—Thomas F. Galvin

[57] ABSTRACT

A semiconductor chip layout including a plurality of logic cells arranged in columns. A cell may encompass one of two different magnitudes of area in the chip; and each column contains only cells having the same area. The layout is particularly appropriate for level sensitive logic systems which utilize both combinatorial as well as sequential networks. The combinatorial (combinational) networks are less orderly and require a greater number of selectable input connections, hence more area, than the sequential circuits. The wide and narrow columnar architecture allows a much greater circuit packing density on a chip, resulting in a substantial increase in the number of circuits for a given chip area. Performance is also increased because of the reduced area required by the sequential circuits.

25 Claims, 16 Drawing Figures

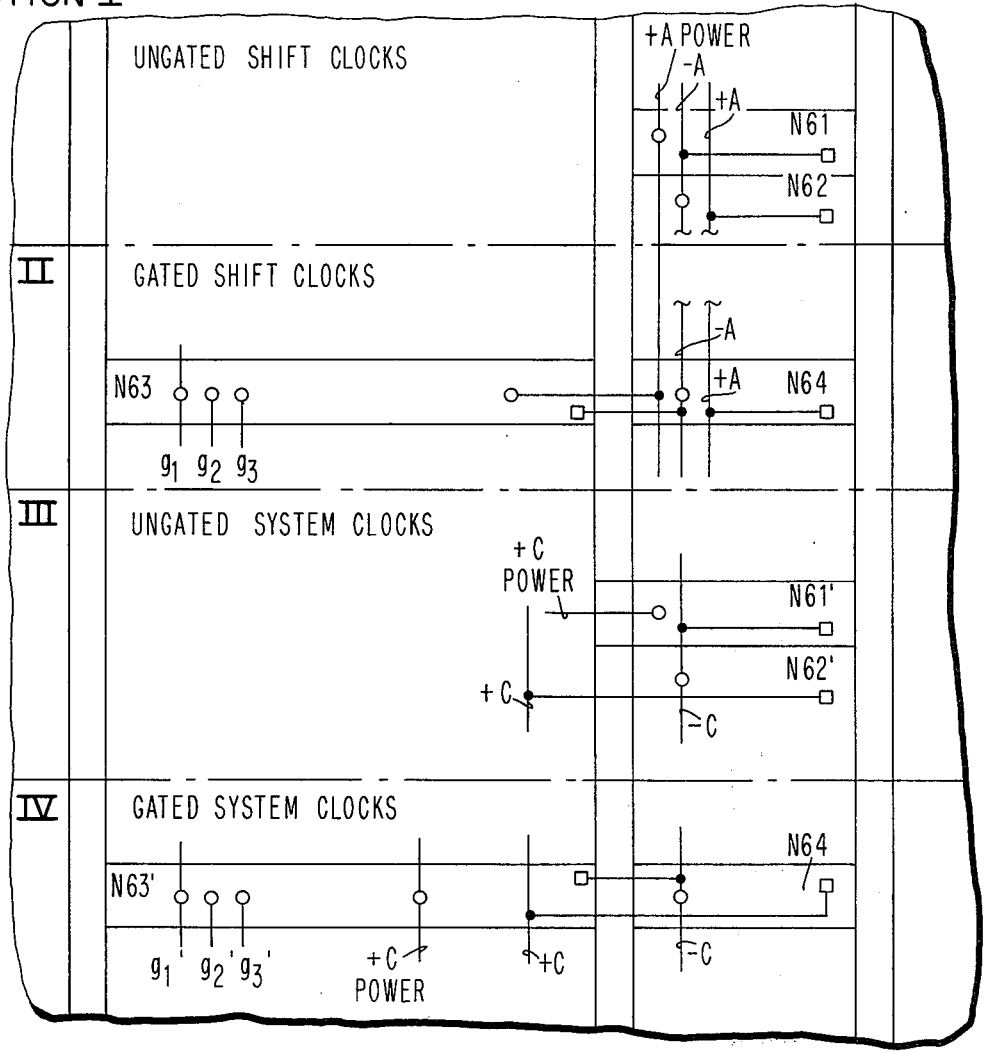
FIG. 11
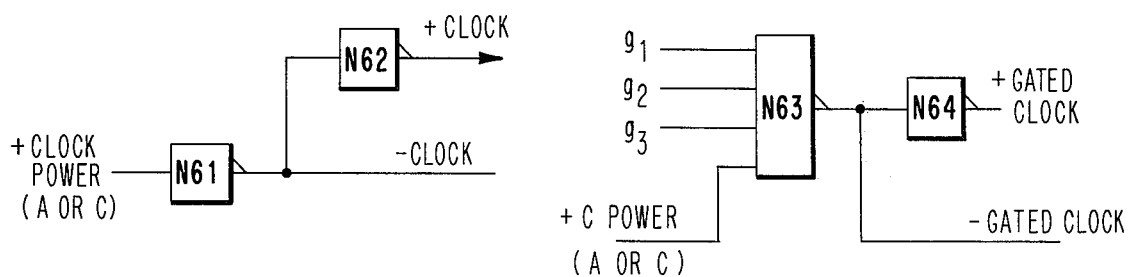
FIG. 12
FIG. 13

HIGH DENSITY SEMICONDUCTOR CHIP ORGANIZATION

CROSS REFERENCE TO A RELATED APPLICATION

This application is related to application Ser. No. 644,775 Filed Dec. 29, 1975 entitled "High Density Semiconductor Chip Layout", in the names of John Balyoz et al. and assigned to the same assignee as the present invention.

The referenced application describes a basic circuit layout in which each circuit includes a first device including an elongated impurity region and a set of other impurity regions in an elongated regions to form a set of diode junctions. The elongated regions are capable of containing a predetermined maximum number of the other impurity regions. A second device is located adjacent the narrow side of the first device. A set of first level conductors extends over the elongated region orthogonally with respect to the elongated direction and are interconnected to selected ones of the other impurity regions. Another conductor in a second level atop the substrate is connected to an impurity region of the second device and extends substantially parallel to the elongated direction.

One of the embodiments described is a TTL circuit in which the first device is a multi-emitter transistor having an elongated base region. The emitters comprised said other regions interconnected to the first set of conductors for receiving input signals. The second device is the output transistor, the collector of which is connected to said other conductor for providing output signals from the TTL circuit, either to other circuits on the substrate or off-substrate.

Such a circuit is shown in FIGS. 4 and 4a of the present application. The preferred embodiment of our invention utilizes this type of circuit to form columns of different magnitudes of area in the chip which are particularly appropriate for level sensitive systems which utilize both combinatorial as well as sequential networks.

BACKGROUND OF THE INVENTION

This invention relates to monolithic, large-scale integrated semiconductor circuit structures and particularly to chips containing level sensitive logic circuits.

In U.S. Pat. No. 3,783,254, entitled "Level Sensitive Logic System", Edward Eichelberger described a novel logic system of combinational networks and sequential circuits which permits both DC as well as AC testing of the logic system. This eliminates the need for special test points in such a system. Dynamic measurements of logic networks that are buried within a particular logic chip can be made without disturbing the state of the system.

In the Eichelberger system, the functional logic units are dependent solely on the occurrence of signals from a number of system clock trains. This is accomplished by using clocked D.C. latches for all internal storage circuitry in the general system logics. The latch circuitry is functionally partitioned along with associated combinational logic networks and arranged in sets. The plural clock trains are synchronous but non-overlapping and independent. The sets of latch circuitry are coupled through combinational logic to other sets of latches that are controlled by other system clock trains or combinations thereof.

In the preferred embodiment of the Eichelberger invention, each latch circuit includes additional circuitry so that each latch functions as a shift register latch (SRL) having input/output and shift controls which are independent of the system clocks and the system input/outputs. With this additional circuitry, all of the system clocks can be deactivated, isolating all of the latch circuits from one another, and permitting a scan-in/scan-out function to be performed. All of the sequential circuitry is thereby reduced to combinational circuitry which is partitioned down to the level of multistage combinational networks. This permits automatic test generation to be performed for testing functionally each circuit in the entire logical unit.

The SRL's are then employed to shift in any desired test pattern of binary ones and zero's where they are retained for use as input to the combinational networks. Results of the combinational logic are clocked into the latches and then shifted out to for measurement and comparison to determine the functional response of the logical unit.

In designing the architecture of logic circuitry on a semiconductor chip, the critical factors of power dissipation circuit type, physical layout and performance must be compromised to achieve low cost. Recently, the physical layout or architecture of the chip has begun to receive increased consideration. Once a circuit family, such as TTL, DTL, etc. has been chosen, the power dissipation is more or less fixed. The performance of the design, consisting of intracell and intercell delays, is also fixed both by the circuit family as well as the physical layout. Thus, the physical layout is the remaining factor over which the semiconductor structure or circuit designer has some control.

One example of a chip architecture, or layout, which is adaptable to incorporate level sensitive logic circuits is described in the application by E. E. Cass, Ser. No. 483,463 filed June 26, 1974 and assigned to the same assignee as the present application. In that layout, the cells are arranged in an orthogonal array, with the cells in substantially parallel rows in both orthogonal directions. In the preferred embodiment of the Cass invention, the cells are arranged in blocks which are two cells wide in the Y direction and four cells wide in the X direction. Each cell takes up substantially the same amount of chip area and has substantially the same layout configuration as every other cell. The chip layout features a regularly-structured matrix of logic gates exhibiting a nearly equal preference for data flow progression in both horizontal and vertical directions.

The Cass invention has been successful in reducing both the number of required metallization levels for intra- and intercell connections as well as the size of the cells as compared to prior art layouts. In addition, the "personalization" of the chip, i.e., the placement of the metallization wiring to define a specific chip circuit structure by computerized design automation, is substantially easier with the Cass layout than with previous designs. However, a significant amount of chip area is unused for active devices because of the space required by the metallization on the surface of the chip.

SUMMARY OF THE INVENTION

The primary object of our invention is to increase the circuit density of logic cells in a semiconductor chip.

More specifically, it is an object of our invention to increase the density of a chip layout in which the circuits adhere to the Eichelberger level sensitive logic system.

The layout features two cells of the same basic circuit type, such as TTL, but encompassing different chip areas. Groups of cells encompassing the same area are arranged in columns so that the cells making up the combinatorial networks are arranged in different columns from the cells making up the sequential circuit networks. Input connections to the cells are made by conductive channels which run parallel to the array direction. We have designed the level sensitive logic system so that the sequential circuit networks, which may be clocked D. C. latches, and are preferably shift register latches (SRL's), require only a small fraction of the total vertical channel capacity. This is due to the regular structure of the clocks and other interconnections. Thus, a narrower column with fewer vertical channels will suffice for the sequential circuits, as compared to the combinatorial circuits.

Our chip layout is significantly different from the layout described in the above-referenced Cass Application, which uses a regularly-structured matrix of logic gates having a nearly equal preference for data flow progression in both horizontal and vertical directions. In our invention, the gates (cells) encompass different areas; and the vertical channels carry most of the signals.

With particular reference to the level sensitive logic system of the Eichelberger patent, gates for the combinational networks are made wider than the SRL gates and are arranged in "wide" columns. The gates for the shift register latches are narrower and are placed in "narrow" columns. These may easily be interconnected by automatic placement and wiring programs as they presently operate on other types of macros. Moreover, the power-performance product of the SRL's can now be optimized independently of the combinational gates.

In the preferred embodiment, the data input gates of the SRL's are preferably placed in a wide column adjacent to the SRL of which they are a part. This is preferable because of the extendability of the data input function to other input gates and the resultant non-regularity of the function itself. In addition, placing the data input gates in narrow columns would impose a heavy burden upon adjacent horizontal channels and tends to disrupt the vertical data flow patterns.

BRIEF DESCRIPTION OF THE DRAWING

FIG. 11 illustrates the chip layouts in accordance with our present invention of various types of shift clocks used in the Eichelberger level sensitive logic system.

FIGS. 12 and 13 are block diagrams of the clock circuits illustrated in FIG. 11.

DETAILED DESCRIPTION OF THE INVENTION

Figure 1:
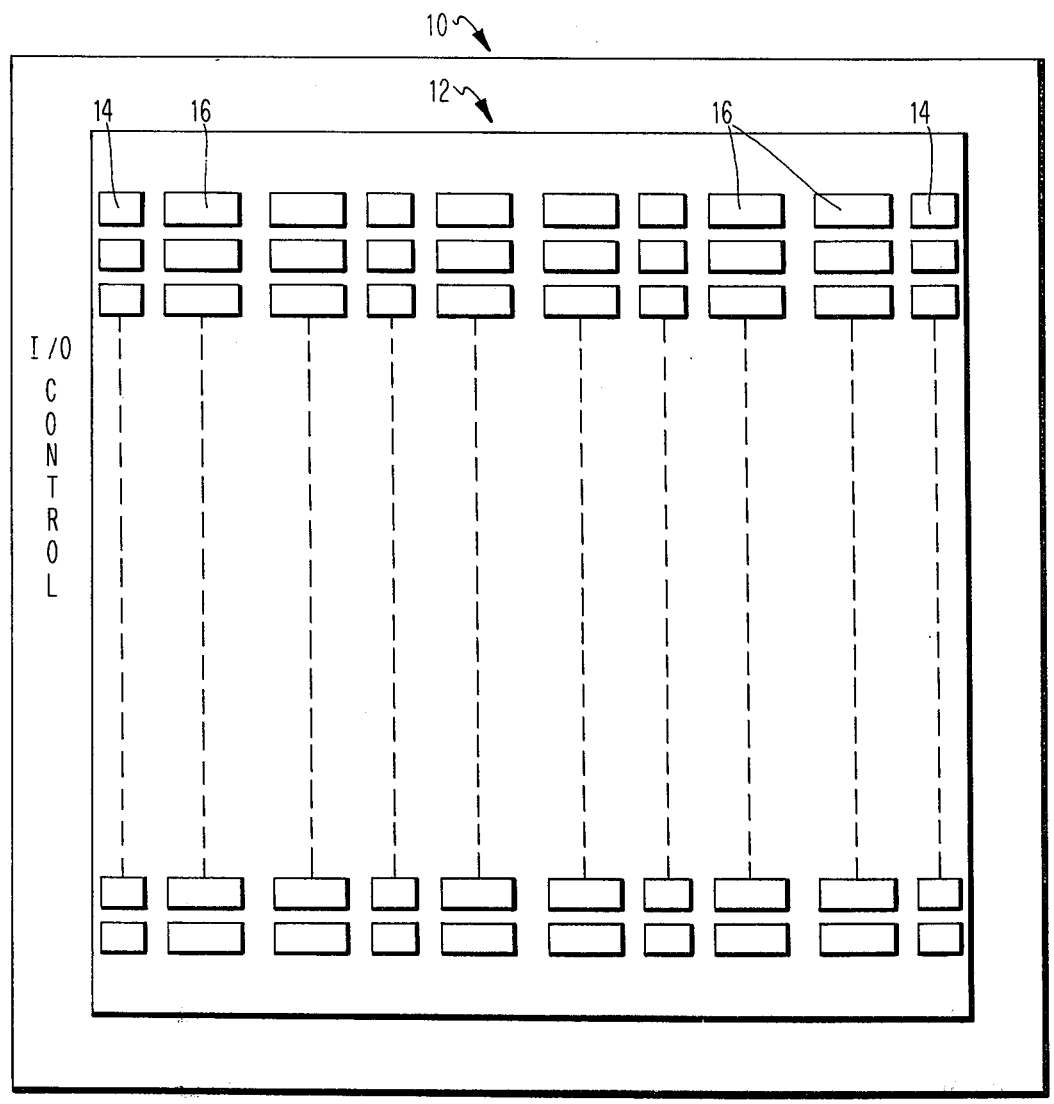
FIG. 1 is a diagramatic, plan view of the semiconductor substrate without metallization which shows the columnar arrangement of cells in accordance with our invention.

As illustrated in FIG. 1, the integrated circuit network is fabricated on a semiconductor chip 10 and includes an array 12 of columns of cells 14 and 16. The periphery 13 of the chip is reserved for I/O control circuits such as receivers and drivers. These are conventional in the art and form no part of our invention.

Cells 14 are arranged in columns which are separate from the columns containing cells 16. Each of the cells 14 and 16 is a logic network which performs a basic logic function, such as the NAND function. In the preferred embodiment, cells 16 are arranged to perform combinatorial logic while cells 14 are interconnected to perform sequential switching, as will be described in much greater detail in succeeding portions of this specification. The chip area encompassed by each of the cells 16 is greater than that encompassed by each of the cells 14 due to the number of input connections required by the former. The input connections are provided by conductive channels within a first level of metallization (not shown) which are disposed in the array direction. The outputs from the cells are provided by conductive channels within a second level of metallization (not shown). These are disposed in a direction transverse to the array direction. Adjacent each wide cell is a narrow cell and vice-versa. In a practical embodiment of our invention, there are six columns containing wide cells 16 and four columns containing narrow cells 14. Other specific layouts are, of course, within the scope of our invention.

Figure 2:
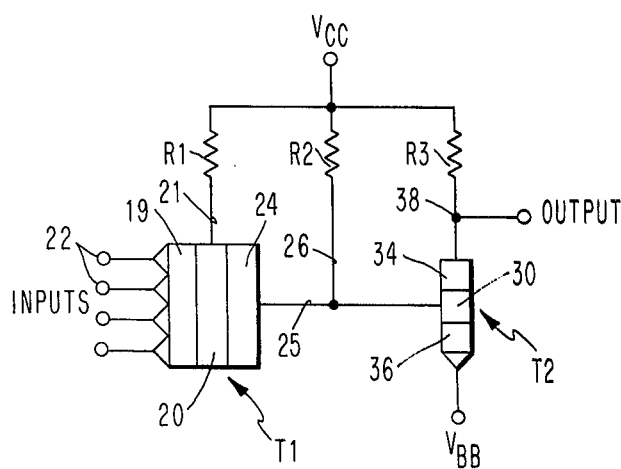
FIG. 2 is a circuit diagram of a TTL NAND gate which is the preferred circuit used in our structure.

FIG. 2 is the preferred embodiment of the basic logic circuit which is used to form both cells 14 as well as cells 16. The circuit is that of a typical transistor-transistor logic (TTL) circuit. Numerous other types of TTL circuits, which utilize extra transistors or diodes to provide added or special functions could be used, if required in a particular logic design.

These latter circuits are also contemplated for use in our inventive layout. In addition, other types of circuit families, such as diode-transistor logic (DTL) and merged-transistor logic (MTL) circuits could be used. The latter type of logic circuitry has been described in the publication by Berger and Wiedmann "Merged-Transistor Logic MTL — A Low Cost Bi-Polar Logic Concept", IEEE Journal of Solid State Circuits, Volume SC-7, No. 5, October 1972.

Figure 3:
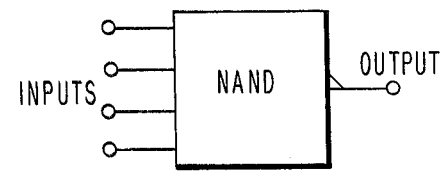
FIG. 3 is a block diagram of the gate of FIG. 2.

The circuit in FIG. 2 performs the NAND function shown in the block diagram in FIG. 3. A NAND gate provides a positive or "up" level output for all input combinations except for the combination where all inputs are positive. Input transistor T1 is a multi-emitter device coupled at its collector output 24 to the base of a single-emitter transistor T2. Resistors R1, R2 and R3 provide appropriate biasing to transistors T1 and T2. If required by the circuit design, the bases of transistors T1 and T2 could be clamped to their collectors by Schottky barrier diodes. As previously noted, the circuit in FIGS. 2 and 3 is well known to those of skill in the art and form no part of our invention in itself.

Figure 4:
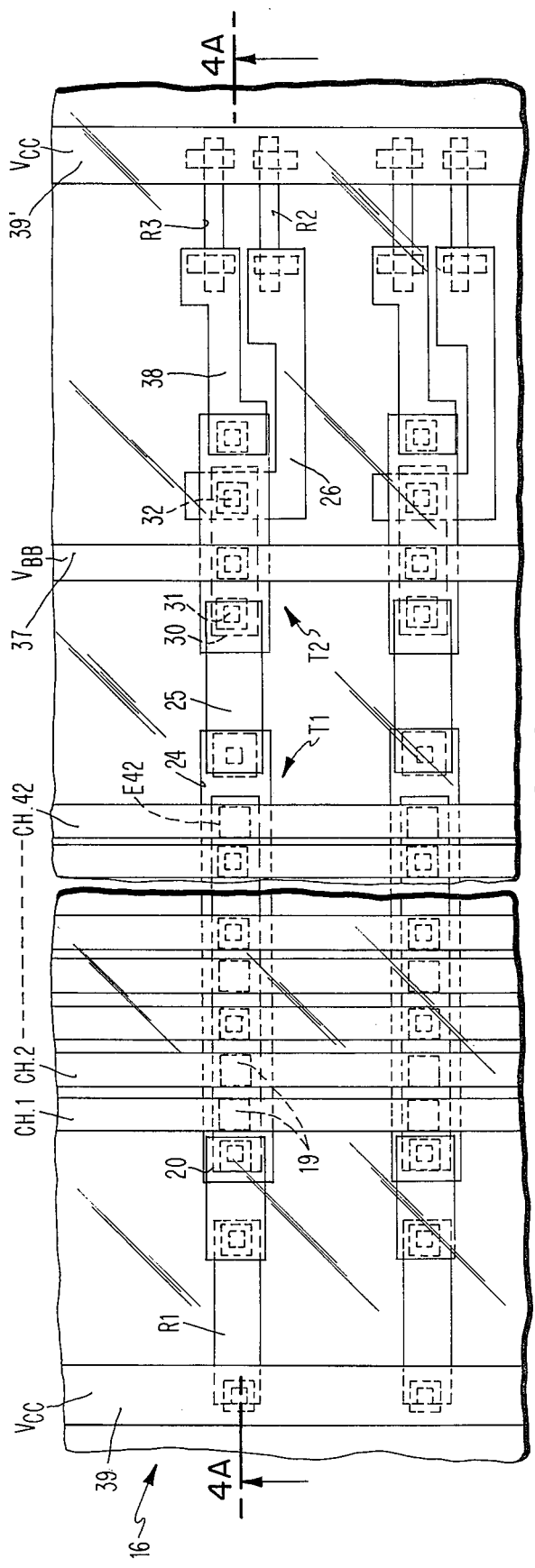
FIG. 4 is a plan view of a pair of wide cells 16 in the block of FIG. 1 which illustrates in greater detail the layout of transistors and resistors in the cell as well as the metallization in the first level above the cell.
Figure 4A:
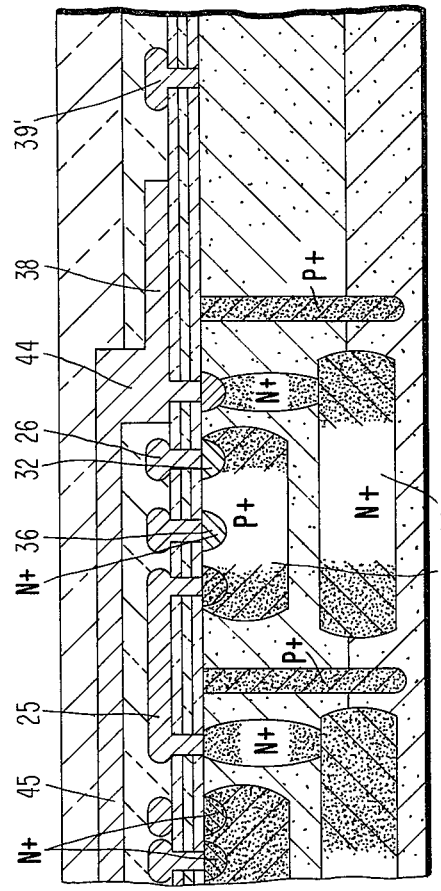
FIG. 4A is a cross-sectional view of the cell of FIG. 4.

FIGS. 4 and 4A are surface and cross-sectional views, respectively, of a pair of wide cells 16 which are formed in chip 10 of FIG. 1. Each cell comprises a plurality of regions of different conductivity types extending into the chip to provide transistors and resistors. These regions are interconnected via a first level of metallization to form a circuit. As connected in FIG. 4, each cell corresponds to the TTL circuit shown in circuit form in FIG. 2. The numerals in FIGS. 4 and 4A correspond to those in FIG. 2.

Transistor T1 comprises an elongated subcollector region 24, an elongated base region 20 and a plurality of emitter regions 19 formed within the elongated base region. The emitter regions are selectively connected through insulator 20 to metallization layers 22. The metallization layers as shown in FIG. 4 are channels formed in paths which run orthogonally with respect to the elongated direction of the cell.

As shown in FIG. 4, there are preferably 42 such paths and four channels may be connected to four emitters of transistor T1. The remaining channels are disposed over emitter regions 19 but are not connected to the emitters in the cell illustrated. These channels may be connected to the emitters of other cells (not shown). In some designs, the same channel will be connected to an emitter region of more than one cell. In other cases, a path may contain more than one channel by forming an electrical discontinuity in the path. In this way, emitter regions in the different cells lying under the same path may serve as isolated inputs to their respective cells.

Base 20 is connected to reference potential $V_{CC}$ via metallization 21 and resistor R1. Transistor T2 is to the right of T1 in FIGS. 4 and 4A and comprises subcollector 34, base 30 and a single emitter 36. Emitter 36 is connected to reference potential $V_{BB}$ which is supplied by conductive band 37. Base 30 of T2 is connected to the collector 24 of T1 by line 25.

Resistors R1, R2 and R3 are formed in a standard manner within epitaxial layer 4 either by diffusion of N+ conductivity dopants or by ion implantation of the dopants. Resistor R1 is connected to reference potential $V_{CC}$ by first level conductor 39 which runs parallel to the emitter input channels. Potential $V_{CC}$ is also connected to resistors R2 and R3 via conductive channel 39'. Resistor R2 is connected to base 30 of T2 by first level conductor 26 and also to the collector of T1 through base region 30 and first level conductor 25. Resistor R3 is connected to collector 34 of T2 by first level conductor 38.

Cells 16 may be segregated electrically from one another by conventional methods such as dielectric isolation or PN junction isolation.

The output of NAND gate 16 is taken from collector 34 by via connection 44 to a second level of metallization 45. The second level of metallization is insulated from the first level by dielectric material 40. As illustrated in FIG. 4A, the collector output is connected to one of the emitter channels 22 by metallization 45. This channel is connected to an emitter of one of the other of cells 16 in chip 10. Alternatively, the collector output of cell 16 may be connected to an input of one of the narrow cells 14 in the same fashion; i.e., by running a second level channel to one of the input channels of a narrow cell illustrated in FIG. 5.

Figure 5:
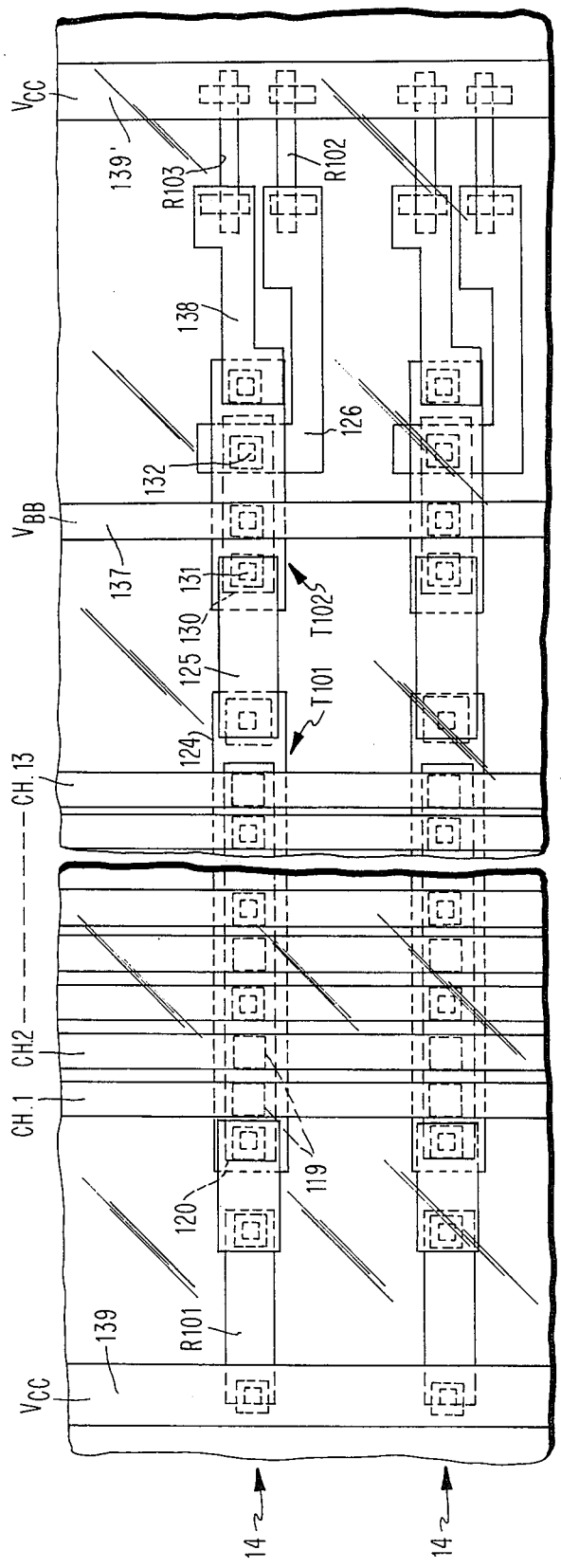
FIG. 5 is a plan view of a narrow cell in the block of FIG. 1.

FIG. 5 is a surface view of a pair of narrow cells 14 formed in chip 10 of FIG. 1. The layout of narrow cell 14 is substantially identical to the layout of wide cell 16 illustrated in FIGS. 4 and 4A. The sole substantial difference between the cells is the number of channels which run orthogonally with respect to the elongated direction of the cell. For the narrow cell illustrated in FIG. 5, there are only thirteen such channels required. These are illustrated by the symbols CH1, CH2, ... CH13. The numerals identifying the various regions of the gates illustrated in FIG. 5 correspond to the numerals in FIG. 4 except that the numerals in FIG. 5 are increased uniformly by 100. Thus, for example, emitter regions 119 in FIG. 5 corresponds to emitter region 19 in FIG. 4; resistor R11 corresponds to resistor R1 in FIG. 4, and so forth.

As is evident, the number of channel paths in a narrow cell is substantially lower than the number required for a wide cell. This reduced requirement results directly in a considerable saving of space and a consequent ability to form more cells on a given chip area than has been possible heretofore. For example, in an actual embodiment of our invention, four columns of narrow cells replace two columns of wide cells, allowing the formation of 350 additional NAND gates on a single chip. Although we have been specific in reciting the preferred number of channel paths and the number of the cells, it is to be understood that our invention is in no way limited to such quantities.

The cells illustrated in FIGS. 4 and 4A are not, in themselves, our invention. Moreover, as previously discussed, our invention is not limited to the TTL type circuitry illustrated. Any circuit family such as DTL and MTL may be used.

Figure 6:
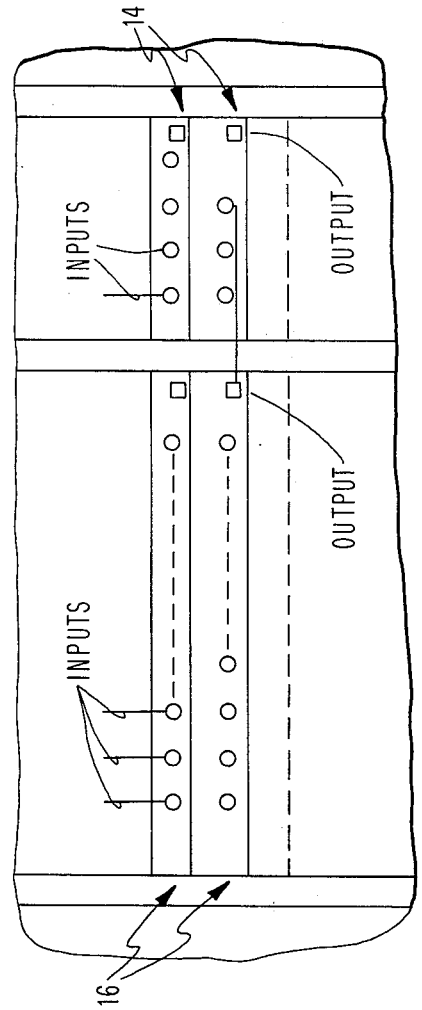
FIG. 6 is a schematic representation of wide cells 16 adjacent narrow cells 14 in the chip structure of FIG. 1.

FIG. 6 is a diagramatic representation of a pair of cells 16 and a pair of narrow cells 14 in adjacent columns in a chip. Due to the complexity of the semiconductor layouts illustrated in FIGS. 4, 4A and 5, the "shorthand" representation in FIG. 6 is used in subsequent figures to illustrate various embodiments of our invention.

In FIG. 6, each cell is substantially rectangular, having inputs denoted by circles: 0 and outputs denoted by squares: ☐ . For ease of illustrating the interconnections between cells, which actually occur on a second level of metallization, the outputs in a given cell are placed somewhat below the inputs.

Relating FIG. 6 to FIGS. 4, 4A and 5, the inputs: 0 are the emitters of the input transistors, the outputs: ☐ are the collectors of the output transistors, the vertical lines to the inputs are the first level conductive channels, and the horizontal lines from the outputs are the second level conductive channels.

The remaining figures in this application, FIGS. 7–15, illustrate various chip layouts, according to our invention, for circuits and systems first described in the above-referenced patent of Edward Eichelberger entitled "Level Sensitive Logic System," U.S. Pat. No. 3,783,254. A general abstract of the teachings in the Eichelberger patent has already been given in the section of this application entitled "Background of the Invention". More specific references to the particular figures and details of the patent are given in succeeding sections of the application when necessary to assure a complete understanding of our invention.

Figure 15:
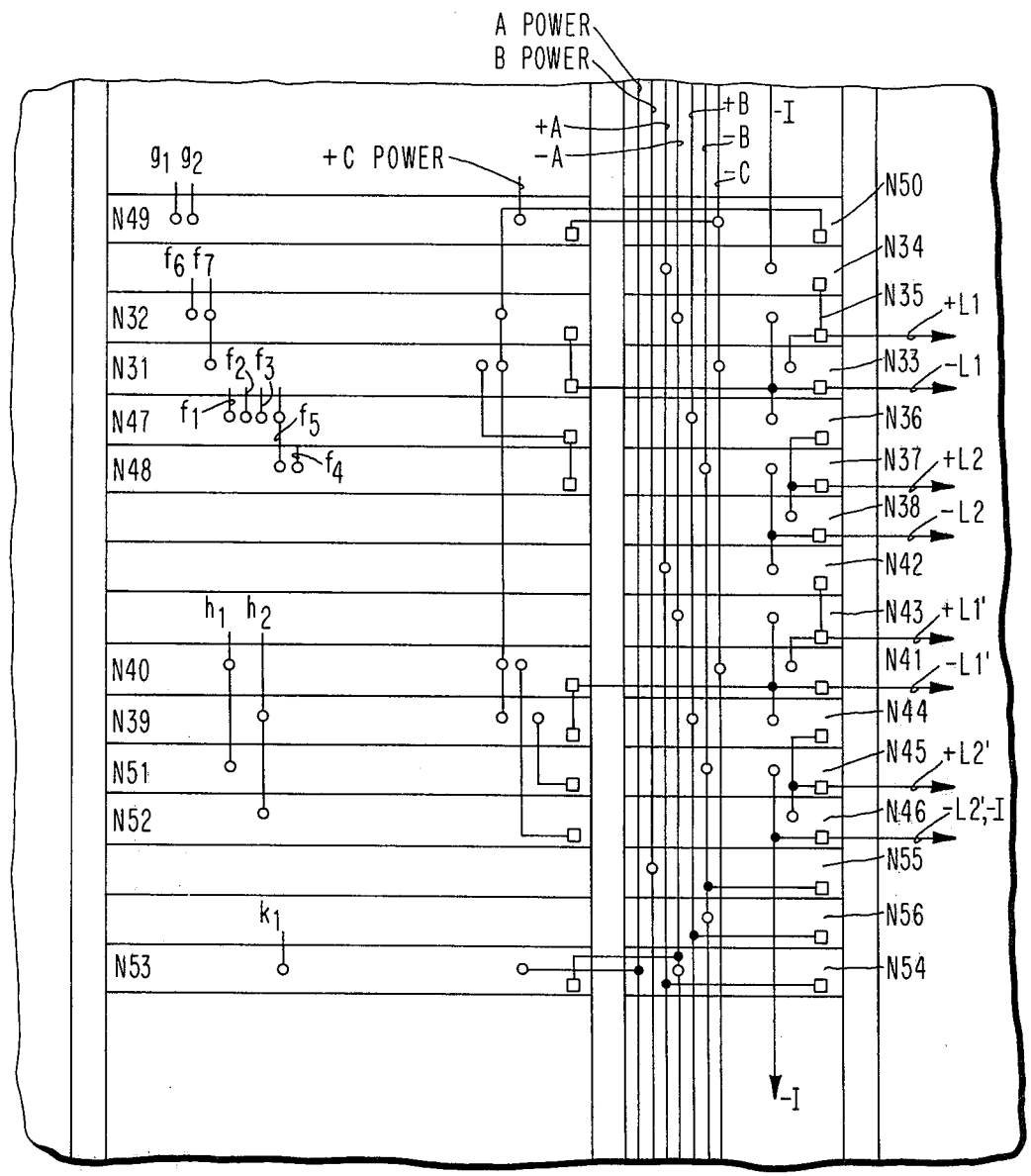
FIG. 15 is a chip layout of the system in FIG. 14 in accordance with our present invention.

The present application emphasizes the layout of shift register latches (SRL's) in narrow columns of the semiconductor chip. (Certain gates in the SRL's, particularly the data input gates are treated as part of the combinational network for reasons to be described). The layout of the combinational networks in wide columns is relatively straightforward, particularly when the SRL layouts are appreciated, and is illustrated in FIG. 15 only.

The storage elements within a level sensitive logic system are level sensitive devices which do not have any hazard or race conditions. Circuits meeting this requirement are generally classified as clocked DC latches which contain data (excitation) and clock inputs. When the clock inputs are all in a given state, the data inputs cannot change the state of the latch. However, when a clock input to a latch is in the other state the data inputs to that latch control the state of the latch in a DC manner.

As stated in the aforementioned Eichelberger application, the type of clocked DC latch which is best suited to level sensitive systems is the SRL. SRL's have the general capability of stopping the system clock and shifting out the status of all latches and/or shifting in new values into each latch. This capability is referred to as scan-in/scan-out; it reduces the testing of the functional unit from sequential testing to combinational testing, which is substantially easier. This is accomplished by including additional circuitry for converting clocked DC latches into shift register latches. For these reasons, all of the latches illustrated in the FIGS. are SRL's, although clocked D.C. latches are also within the scope of the invention.

The SRL's shown in the Figures are level sensitive, i.e., the steady state response to any allowed input change-of-state is independent of circuit delays within the entire system. The entire system is driven by two or more non-overlapping clock signal trains that are independent of each other. Each of the clock signals in a train need have a duration sufficient only to set a latch. The excitation and the gating signals for any clocked latch are a combinational logic function of the system input signal and the output signals from latches that are controlled by clocked signal trains which must be other than the train providing an input to such clocked latch.

The best way to accomplish this is to have each such clocked latch controlled by exactly one of the system clock signals. When the clock signal, denoted C, is in an "on" position, the clocked latch is set to the state determined by the excitation signals, denoted $d1, d2 \ldots di$, for that latch. It is a necessary requirement of the generalized structure that two or more independent clock signal trains be employed to control the clocking of the signals in the entire system. A latch or latch set which is controlled by one clock signal train cannot be coupled back through combinational logic to other latches that are controlled by the same clock signal train.

Figure 7:
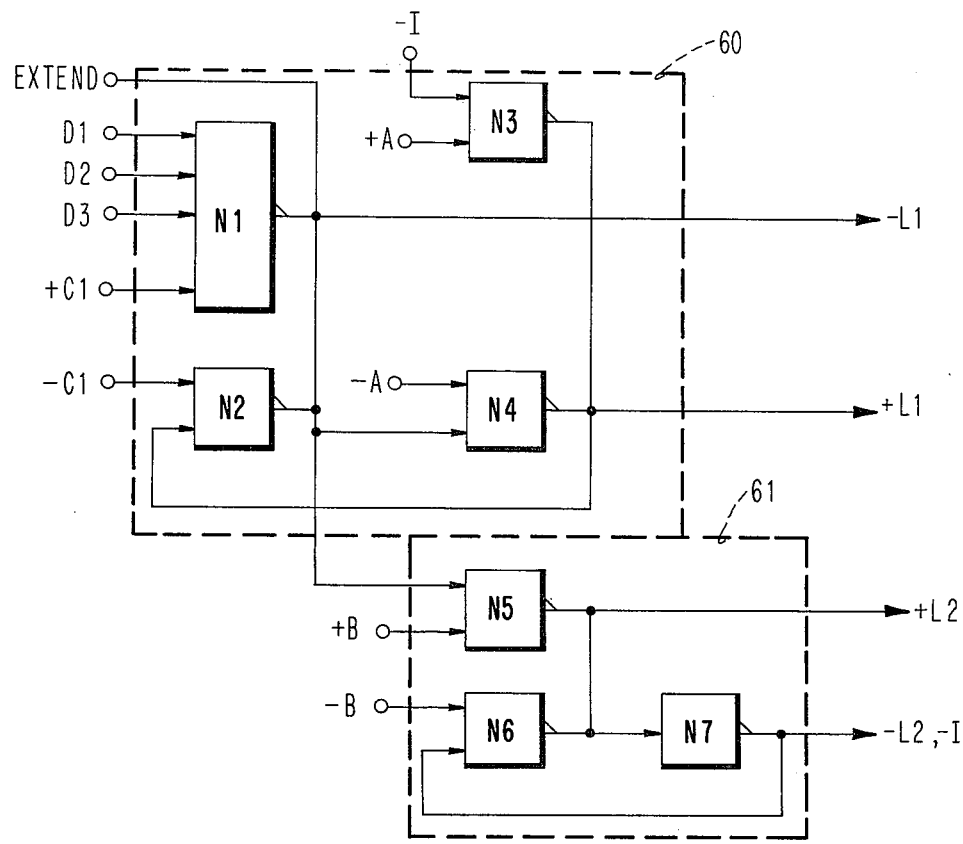
FIG. 7 is a block diagram of a polarity-hold shift register latch circuit for use in the Eichelberger level sensitive logic system.

Turning now to FIG. 7, there is shown a circuit diagram of a polarity-hold shift register latch (P-H SRL). This SRL is composed of two separate latches: a data input latch 60 and a second latch 61. The second latch provides for operation as one position of a shift register with shift controls, A and B, independent of the system clock, C. The data input latch 60 is comprised of NAND gates N1, N2, N3 and N4. Gate N1 is termed a data input gate, as it is the only gate in the SRL which receives data directly during normal system operation. It performs a combinatorial function. The second latch 61 comprises gates N5, and N6 and N7. As shown in the figure, latch 60 is set by either the system clock signals, ±C1 and the polarity-hold data inputs D1, D2, and D3, or a "scan data" signal, −I, and shift control A clock inputs, ±A. Latch 61 is fed by an output from both data latch 60 and shift control B clock inputs ±B. Signals ±A, ±B, and ±C1 are each generated from individual single signals A power, B power, C power by other NAND gates (not shown). Shift control signals ±A, ±B and scan signal −I function as inputs to all SRL's in the entire logic system. Clock signal ±C1 is used for an SRL or a set of related SRL's. Separate clock signals $Ci$ are provided for other SRL sets.

The data inputs are received from the outputs of a combinatorial network. The EXTEND line represents separate input NAND gates (not shown) which have unclocked data inputs similar to inputs D1, D2, and D3 of gate N1. However, the logic function feeding the EXTEND input must be clocked by the same system clock signal +C1 which controls the SRL.

System data outputs ±L1 may be taken from the outputs of data input latch 60; and system data outputs ±L2 may be taken from the outputs of the second latch 61. Outputs ±L1 may be fed forward to a combinatorial network as well as to the data input gate of other SRL's controlled by a different system clock signal, say C2. Outputs ±L2 are fed to a combinatorial network which can be either the same network that generated SRL inputs D1, D2, D3 or another network feeding SRL's.

For scan-in purposes, output −I is fed to the −I input of the next succeeding SRL in the set of SRL's which comprises the entire system. The system clock inputs ±C1 control the system data inputs D1, D2, D3 and EXTEND inputs such that when the system clock C1 is in its "off" state, none of these data inputs can affect the data stored in the data input latch 60. When the system clock is "on" and the shift A clock is "off", the system data inputs determine the state of latch 60. When the shift B clock is "on", the second latch 61 acquires the data bit stored in data input latch 60.

Figure 8:
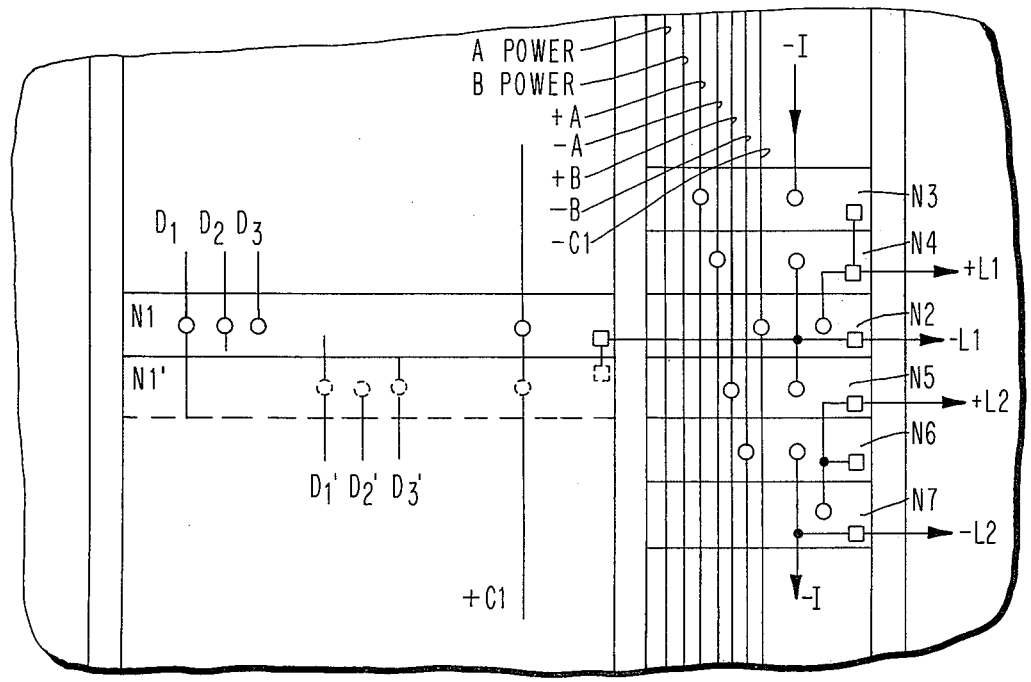
FIG. 8 illustrates a plan view of the layout in a semiconductor chip of the latch of FIG. 7 in accordance with our invention.
Figure 9:
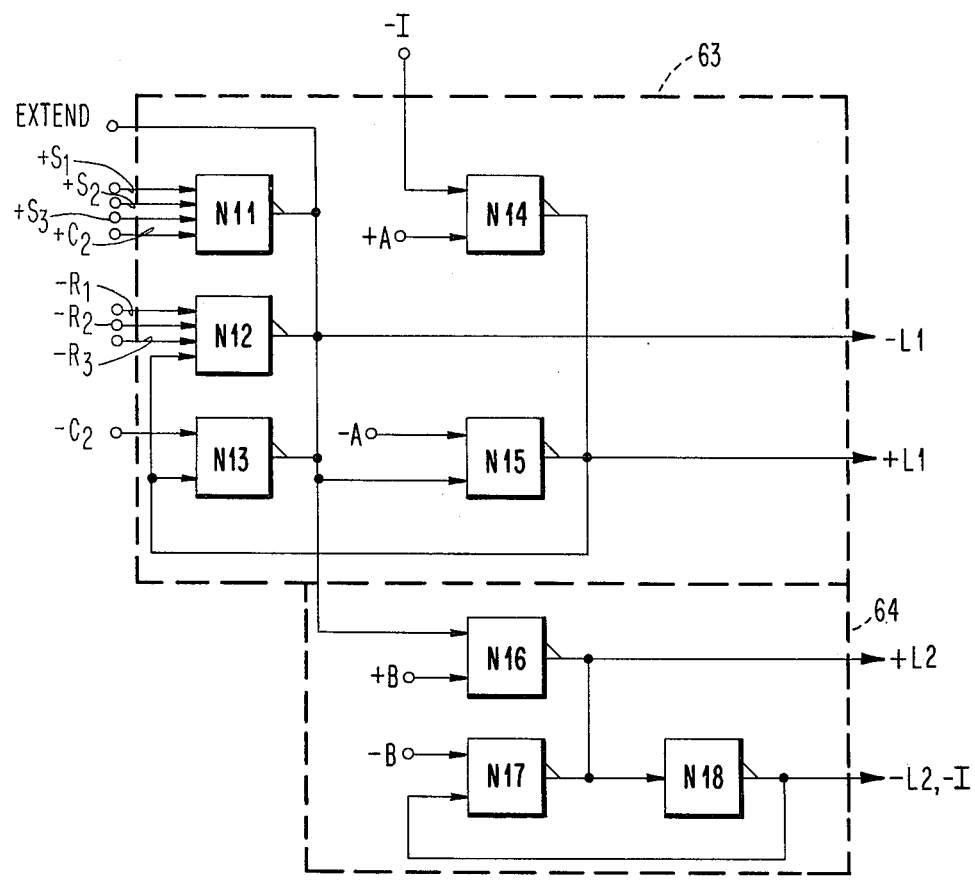
FIG. 9 is a block diagram of a set-reset shift register latch for use in the Eichelberger level sensitive logic system.

The latch shown in FIG. 7 performs the same function as the polarity-hold latch illustrated in FIG. 9 of the above referenced Eichelberger patent, U.S. Pat. No. 3,783,254. The P-H SRL of the present FIG. 7 would be used as a SRL in block 33 of FIG. 7 of that patent. Our invention lies in the layout of circuits such as is illustrated in the present FIG. 7 on a semiconductor chip as illustrated in FIG. 8 of the present application.

In FIG. 8 the data, or excitation, inputs D1, D2, D3 inputs, which are derived from the outputs of a combinatorial network, are connected to the input terminals of a gate in the wide area of cells on the left. Thus, inputs D1, D2, and D3 are transmitted to the emitters of a TTL NAND gate N1 which corresponds to gate N1 in FIG. 7. The optional EXTEND inputs, designated D1', D2', and D3' form the inputs to separate emitters in another NAND gate identified as N1'. The remaining gates in the SRL are placed in the narrow column and their inputs are obtained from the conductive vertical channels shown.

As previously noted, both gate N1 and also gate N1' perform combinatorial functions. The placement of these data input gates of the SRL in a wide column adjacent a narrow column containing the remaining gates is desirable. First, each data input requires a vertical channel. Placement of the gate in a narrow column might exhaust the channels available, particularly in view of the extendability of the data input gates. Secondly, the data inputs themselves are commonly derived from other combinatorial networks. If the data input gates were placed in a narrow column, an excessive number of horizontal channels would be required to connect D1, D2, D3 . . . from a wide column to a narrow column.

Another option available in our design is to perform the combinatorial function on D1, D2, and D3 in other gates in a wide column. The output D1·D2·D3 would then be connected via a horizontal channel to a NAND gate equivalent to N1, but having only a single data input and a clock C input, in the narrow column. With this technique, the entire SRL is located in a narrow column. However, this adds one stage of delay to the logic at a minimum.

The SRL outputs L1 and L2 are shown as exiting to the right in FIG. 8. This is for schematic purposes only. In practice, outputs L1 and L2 are fed by a second level of metallization to the inputs of combinatorial cells in a wide column.

It is evident that the utilization of the vertical channels in the narrow column in FIG. 8 is quite efficient. As previously discussed, the number of vertical channels available in the narrow column are thirteen in our preferred embodiment. As shown in the figure, a single SRL takes up nine of the thirteen channels. However, because the shift A, shift B and scan data, I, inputs are shared by all other SRL's in the same narrow column, there is no problem in having too few vertical conductive channels available.

FIG. 9 is a circuit diagram of a set-reset shift register latch (S-R SRL). As with the P-H SRL illustrated in FIGS. 7 and 8, the S-R SRL contains two latches: data input latch 63 comprising gates N11, N12, N13 N14 and N15; and a second latch 64 for performing the shift register function comprising gates N16, N17 and N18. The circuit function and general layout of the S-R SRL is quite similar to that of the P-H SRL.

Figure 10:
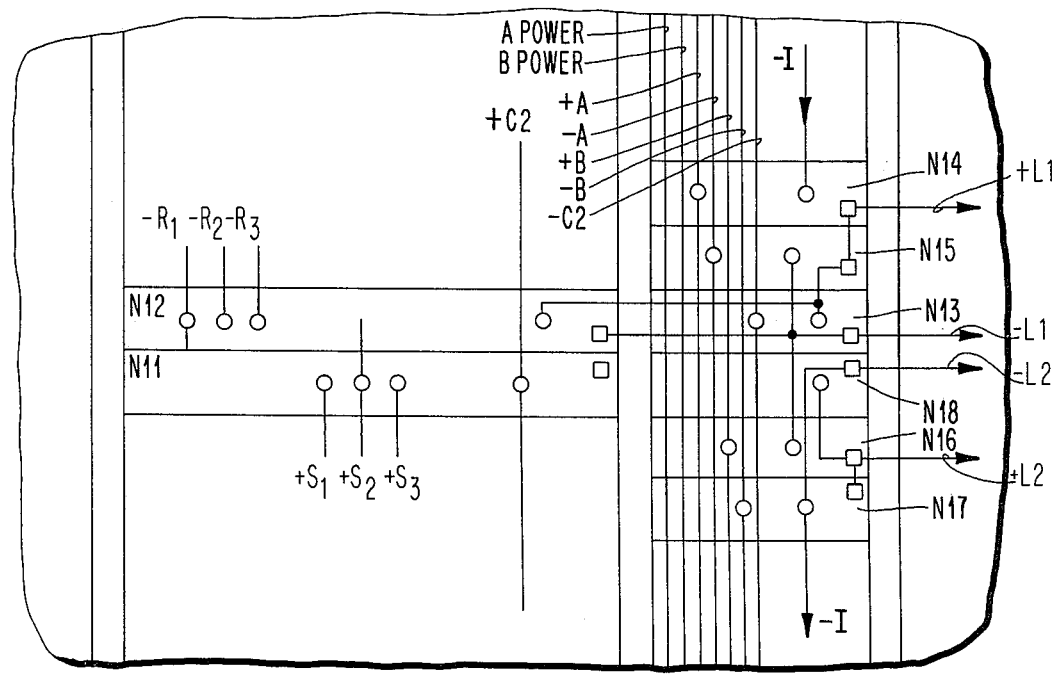
FIG. 10 is a plan view of the layout of the circuit of FIG. 9 in accordance with our invention.

As shown in FIG. 10, the gates receiving the SET inputs S1, S2 and S3 and the RESET inputs, −R1, −R2 and −R3 are disposed in the wide column of the chip with all other gates in the SRL in the narrow column. Again, the efficiency in the narrow column is high in that ten of the thirteen possible channels are used.

The grouping of SRL's in regular narrow columns offers the advantage of simplifying the distribution systems for both the shift and the system clocks. FIG. 11 illustrates four different layouts of SRL clock drivers useful in level sensitive logic systems. FIGS. 12 and 13 are logic diagrams of the clock drivers illustrated in layout form in FIG. 11. The layouts of Sections I and II in FIG. 11 correspond to the diagram of FIG. 12; and the layouts of Sections II and IV correspond to FIG. 13.

Section I of FIG. 11 illustrates the layout for an ungated shift clock A in which the clock driver macro is contained wholly within a narrow column. (This applies to shift clock B also). Clock redistribution throughout the chip is thereby made easy, as is the design automation macro placement program. The input gate N63 for the gated shift clock in Section II is disposed in the wide column for substantially the same reasons stated previously concerning the data input gates of the SRL's. The gating conditions for the gated shift clocks are for the most part generated by combinatorial logic contained in the wide column. It would be wasteful of the vertical channels in the narrow column to place inputs G1, G2, G3 there. The shift clock powering line, denoted A power, is run in the narrow column for both gated and ungated shift clocks because the structure of the shift clock is very regular across the semiconductor chip.

The clock powering lines for both ungated as well as the gated system clocks, C, illustrated in Sections III and IV are brought to the clock driver macro horizontally from a wide column. It is common for the system clock to have logic performed upon it at some earlier stage of repowering even if the C clock driver isn't gated. Such functions include interrupts and scan system clock control.

The outputs of the shift clock driver, denoted ±A in Sections I and II are distributed to SRL's in the narrow column. The output −C for system clocks is distributed in the narrow column where it is used, for example, by gate N2 of the SRL in FIG. 7. The +C system clock output is transmitted to the wide column where it is used for SRL data input gates and extended data input gates, for example, gate N1 of FIG. 7.

Figure 14:
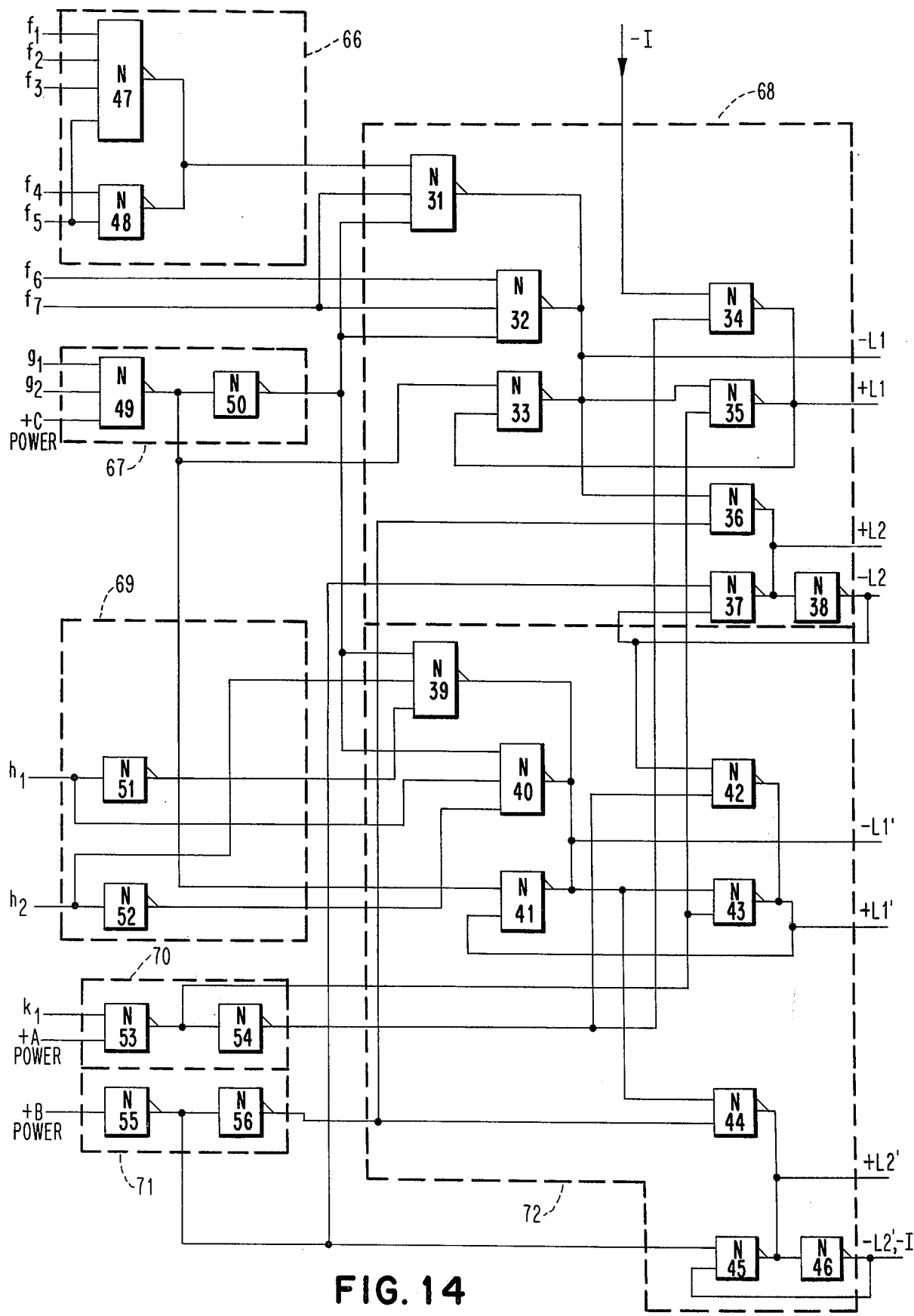
FIG. 14 is a block diagram of the organization of a generalized logic system of the type used in the Eichelberger level sensitive logic system.

Referring now to FIGS. 14 and 15, a complete level sensitive logic network including SRL's, associated clock distribution circuits and combinatorial logic is illustrated.

In FIG. 14, the circuits are divided by type into blocks defined by dashed lines. Blocks 66 and 69 are combinatorial networks; blocks 68 and 72 are P-H SRL's as previously shown in FIG. 7. Block 67 is a system clock driver and blocks 70 and 71 are shift control clock drivers as previously shown in FIGS. 12 and 13. Gates N31 and N32 in SRL block 68 serve as data input gates, as do gates N39 and N40 in SRL block 72. The combination of gates N51, N52, N39, and N40 perform the EXCLUSIVE-OR function on inputs H1 and H2. Gates N47, N48, N31 and N32 generate a more complex function of inputs $f_1, f_2, \ldots f_7$.

In the layout of the system in FIG. 15, the combinatorial gates, the SRL data input gates and the clock gates having combinatorial inputs N49 and N53, are placed in the wide column. The remaining SRL clock gates are placed in the narrow column. The rationale for these placements has already been discussed and further discussion at this point would be redundant.

The clock drivers are placed adjacent and on either side of the SRL gates which they service. The clock driver gates in the narrow column could also be interspersed within the SRL gates. Deviations from these layouts, such as placing a system clock driver in a location distal from its associated SRL, are generally undesirable. Such a layout would require additional vertical channels in the narrow column.

While the invention has been particularly shown and described with reference to preferred embodiments thereof, it will be understood by those skilled in the art that the foregoing and other changes in form and detail may be made therein without departing from the spirit and scope of the invention. For example, while the preferred embodiment has been described in terms of a TTL NAND gate, other types of circuits such as DTL NAND, MTL NOR, etc. are also effective. This also means that transistors besides the particular NPN bipolar types described in FIGS. 4 and 5 may be used.

We claim:

1. In a semiconductor, integrated circuit chip structure including a plurality of regions of different conductivity types extending into said chip to provide transistors and other circuit elements which are arranged into a plurality of substantially rectangular logic circuit units, the improvement comprising:
first and second groups of said logic circuit units disposed in said semiconductor substrate in at least first and second columnar arrays, respectively;
each said unit being generally elongated in a direction transverse to the array direction and narrow in the array direction, the units in said first group being substantially longer than the units in said second group;
said units containing selectable input signal regions, reference potential terminals, output signal terminals at corresponding fixed positions and input signal terminals at selected ones of said input signal regions; and
first and second groups of conductive channels over the surface of said substrate and insulated therefrom by at least one layer of electrically insulative material, said conductive channels disposed in a direction substantially parallel to said array direction;
said first and second groups of conductive channels being connected to said selected input signal terminals of said first and second groups of logic units, respectively.

2. A semiconductor chip layout as in claim 1 wherein the number of selectable input signal regions for each logic unit in said first group exceeds the number of selectable input signal regions for each unit in said second group.

3. A chip layout as in claim 2 wherein the number of conductive channels in said first and second groups equals the number of selectable input signal regions in said first and second groups, respectively.

4. A chip layout as in claim 1 wherein:
said output signal terminals are contacted by a third group of conductive channels which are insulated from said first and second groups of channels;
said third group being disposed in a substantially transverse direction with respect to said array direction.

5. A chip layout as in claim 1 wherein each said logic unit functions as a NAND gate.

6. A chip layout as in claim 5 wherein each said NAND gate is a TTL circuit having a selected number of emitter inputs which function as said input signal terminals and having a single collector output which functions as said output signal terminal.

7. A chip layout as in claim 6 wherein the number of conductive channels in said first and second groups exceeds the number of emitter input terminals in any single logic unit in said first and second groups, respectively.

8. A chip layout as in claim 7 wherein the number of conductive channels in said first group exceeds the number of conductive channels in said second group.

9. A chip layout as in claim 8 wherein the number of conductive channels in said first and second groups equals the number of selectable input signal regions in said first and second groups, respectively.

10. In a semiconductor integrated circuit chip structure for a logic system including a plurality of regions of different conductivity types extending into said chip to provide transistors and other circuit elements which are arranged into a plurality of substantially rectangular logic circuit units, said logic system including at least one combinational network coupled to accept a set of input signals and to provide a set of combinational signals, and at least one sequential circuit coupled to receive said combinational signals from the network under control of a selected one of clocked signal trains to store indications of the combinational logic and to provide a set of outputs for said indications, the improvement comprising:
first and second groups of said logic circuit units, said first group interconnected as said combinational network and said second group interconnected as said sequential circuit;
said first and second groups being disposed in said semiconductor substrate in at least first and second columnar arrays, respectively;
each said unit being generally elongated in a direction transverse to the array direction and narrow in the array direction, the units in said first group being substantially longer than the units in said second group;
said units containing selectable input signal regions, output signal terminals, reference potential terminals and input signal terminals at selected ones of said input signal regions;
a level of metallization disposed above and insulated from said array by at least one layer of dielectric material, said level including first and second groups of conductive line paths which are substantially parallel to said array direction, and associated with said first and second groups respectively;
said first and second groups of lines being connected to said selected input signal terminals of said combinational network and said sequential circuit, respectively;
a second level of metallization insulated from said first level of metallization by at least one layer of dielectric material; and
conductive line paths formed within said second level, which are in a direction substantially transverse with respect to said columnar array direction, connected to the outputs of said combinational network and said sequential circuit.

11. A chip layout as in claim 10 wherein the number of selectable input signal regions for each logic unit in said first group exceeds the number of selectable input signal regions for each unit in said second group.

12. A chip layout as in claim 11 wherein the number of conductive channels in said first and second groups equals the number of selectable input signal regions in said first and second groups, respectively.

13. A chip layout as in claim 10 wherein each said logic unit functions as a NAND gate.

14. A chip layout as in claim 13 wherein each said NAND gate is a TTL circuit having a selected number of emitter inputs which function as said input signal terminals and having a single collector output which functions as said output signal terminal.

15. A chip layout as in claim 14 wherein the number of conductive channels in said first and second groups exceeds the number of emitter input terminals in any single logic unit in said first and second groups, respectively.

16. A chip layout as in claim 15 wherein the number of conductive channels in said first group exceeds the number of conductive channels in said second group.

17. A chip layout as in claim 16 wherein the number of conductive channels in said first and second groups equals the number of selectable input signal regions in said first and second groups, respectively.

18. A chip layout as in claim 10 wherein said sequential circuit is a clocked D.C. latch.

19. A chip layout as in claim 18 wherein said clocked D.C. latch is a shift register latch which comprises a data input latch and another latch for performing a shifting function.

20. A chip layout as in claim 19 wherein said data input latch includes a data input gate which is disposed as a logic unit in said first columnar array.

21. A chip layout as in claim 19 further including: third and fourth groups of logic units for providing system clock signals to said data input latch and shift control signals to said shift register latch, respectively.

22. A chip layout as in claim 21 wherein said logic units are disposed in said second column adjacent the logic units comprising said shift register latch.

23. A chip layout as in claim 21 wherein at one of said third group of logic units is a gated system clock which includes:
a first gate for receiving both combinational signals as well as a clock powering signal and a second gate having an input connected to the output of said first gate;
said first gate being disposed in said first columnar array; and
said second gate being disposed in said second columnar array.

24. A chip layout as in claim 21 wherein at least one of said fourth group of logic units is a gated shift control clock which includes:
a first gate for receiving both combinational signals as well as a clock powering signal and a second gate having an input connected to the output of said first gate;
said first gate being disposed in said first columnar array; and
said second gate being disposed in said second columnar array.

25. A chip layout as in claim 19 wherein said shift register latch includes an EXTEND gate disposed in said first columnar array.

* * * * *